United States Patent
Watanabe et al.

(10) Patent No.: US 9,076,761 B2
(45) Date of Patent: Jul. 7, 2015

(54) SILICON CARBIDE SEMICONDUCTOR DEVICE AND METHOD FOR MANUFACTURING SILICON CARBIDE SEMICONDUCTOR DEVICE

(75) Inventors: Tomokatsu Watanabe, Tokyo (JP); Naruhisa Miura, Tokyo (JP); Masayuki Furuhashi, Tokyo (JP); Shiro Hino, Tokyo (JP); Toshikazu Tanioka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/116,259

(22) PCT Filed: May 31, 2012

(86) PCT No.: PCT/JP2012/064122
§ 371 (c)(1),
(2), (4) Date: Nov. 7, 2013

(87) PCT Pub. No.: WO2012/172988
PCT Pub. Date: Dec. 20, 2012

(65) Prior Publication Data
US 2014/0061675 A1    Mar. 6, 2014

(30) Foreign Application Priority Data
Jun. 14, 2011 (JP) .................. 2011-131875

(51) Int. Cl.
*H01L 29/417* (2006.01)
*H01L 29/10* (2006.01)
(Continued)

(52) U.S. Cl.
CPC ........ *H01L 29/41741* (2013.01); *H01L 29/105* (2013.01); *H01L 29/7827* (2013.01);
(Continued)

(58) Field of Classification Search
CPC ................. H01L 29/7827; H01L 29/66666; H01L 29/66712; H01L 29/7802; H01L 21/823814; H01L 29/41725
USPC .......... 257/288, 328, 329, E29.027, E29.066, 257/E29.197, E29.198
See application file for complete search history.

(56) References Cited

U.S. PATENT DOCUMENTS 6,653,659 B2 * 11/2003 Ryu et al. .................... 257/77
8,367,536 B2   2/2013 Watanabe et al.
(Continued)

FOREIGN PATENT DOCUMENTS

JP    2006 237116    9/2006
JP    2008 192691    8/2008
(Continued)

OTHER PUBLICATIONS

International Search Report Issued Aug. 7, 2012 in PCT/JP12/064122 Filed May 31, 2012.
(Continued)

Primary Examiner — Eduardo A Rodela
(74) Attorney, Agent, or Firm — Oblon, McClelland, Maier & Neustadt, L.L.P.

(57) ABSTRACT

A silicon carbide semiconductor device that is able to increase the gate reliability, and to provide a method for manufacturing the silicon carbide semiconductor device, and that includes: a source electrode selectively formed on a source region; a gate insulating film formed so as to extend over the source region; and a gate electrode formed on the gate insulating film. The source region includes a first source region located below the source electrode, and a second source region surrounding the first source region. The doping concentration in a superficial layer of the second source region is lower than the doping concentration in a superficial layer of the first source region. The doping concentration in the second source region is higher in a deep portion than in a superficial portion thereof.

9 Claims, 15 Drawing Sheets

(51) Int. Cl.
*H01L 29/78* (2006.01)
*H01L 29/66* (2006.01)
*H01L 29/08* (2006.01)
*H01L 29/16* (2006.01)

(52) U.S. Cl.
CPC ..... *H01L29/41725* (2013.01); *H01L 29/41766* (2013.01); *H01L 29/66068* (2013.01); *H01L 29/7802* (2013.01); *H01L 29/086* (2013.01); *H01L 29/1608* (2013.01)

(56) References Cited

U.S. PATENT DOCUMENTS

| | | | |
|---|---|---|---|
| 8,431,974 | B2 | 4/2013 | Suzuki et al. |
| 8,629,509 | B2 * | 1/2014 | Ryu et al. ............... 257/378 |
| 2002/0149022 | A1 | 10/2002 | Ryu et al. |
| 2005/0001268 | A1 * | 1/2005 | Baliga ............... 257/341 |
| 2011/0204435 | A1 * | 8/2011 | Disney ............... 257/329 |
| 2012/0058617 | A1 | 3/2012 | Watanabe et al. |

FOREIGN PATENT DOCUMENTS

| | | |
|---|---|---|
| JP | 2009 182271 | 8/2009 |
| WO | 2011 010608 | 1/2011 |

OTHER PUBLICATIONS

Office Action issued Jul. 8, 2014 in Japanese Patent Application No. 2013-520500 with partial English language translation.

International Preliminary Report on Patentability and Written Opinion (with English Translation) issued on Jan. 3, 2014 in PCT/JP2012/064122.

Office Action issued Feb. 24, 2015 in Japanese Patent Application No. 2013-520500 (with partial English translation).

* cited by examiner

F I G . 1
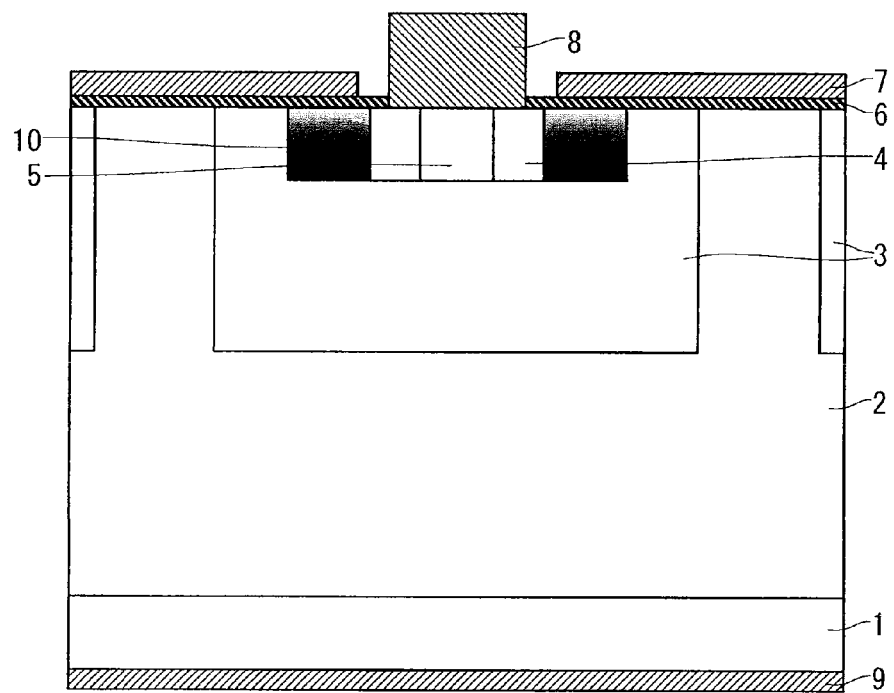

F I G . 4
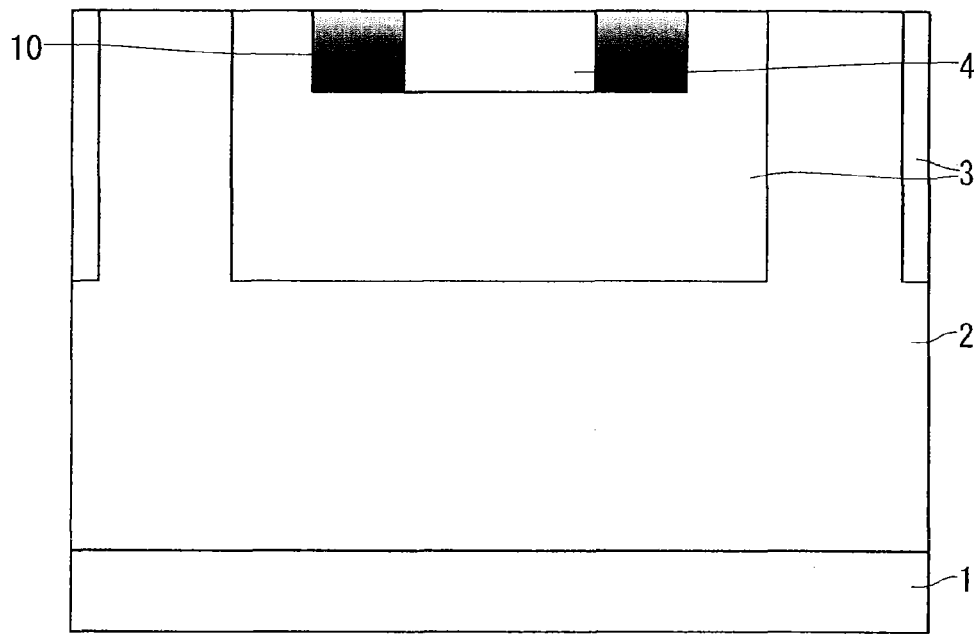
F I G . 5
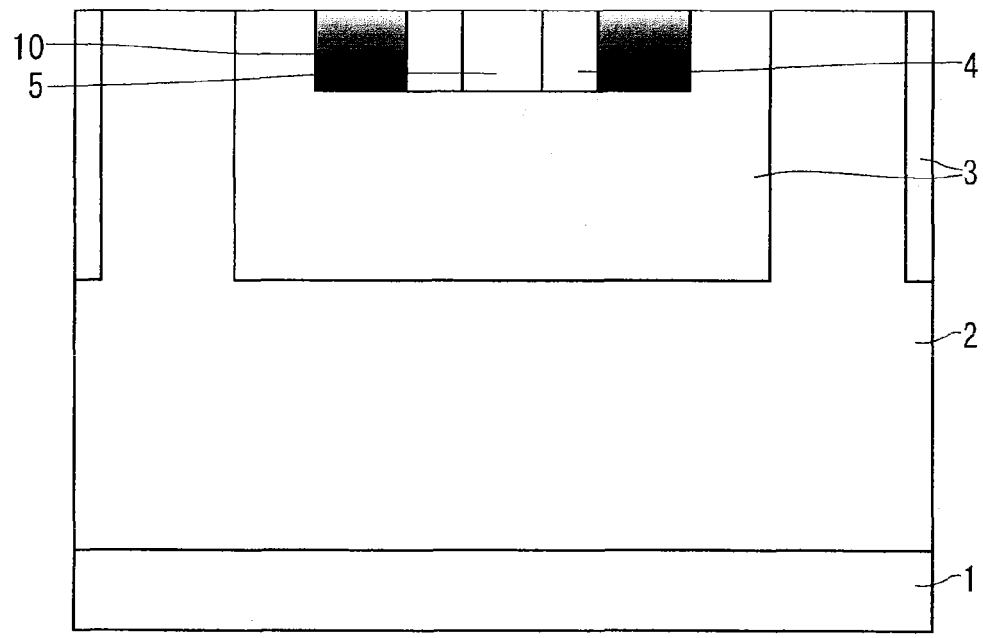

F I G . 2 0
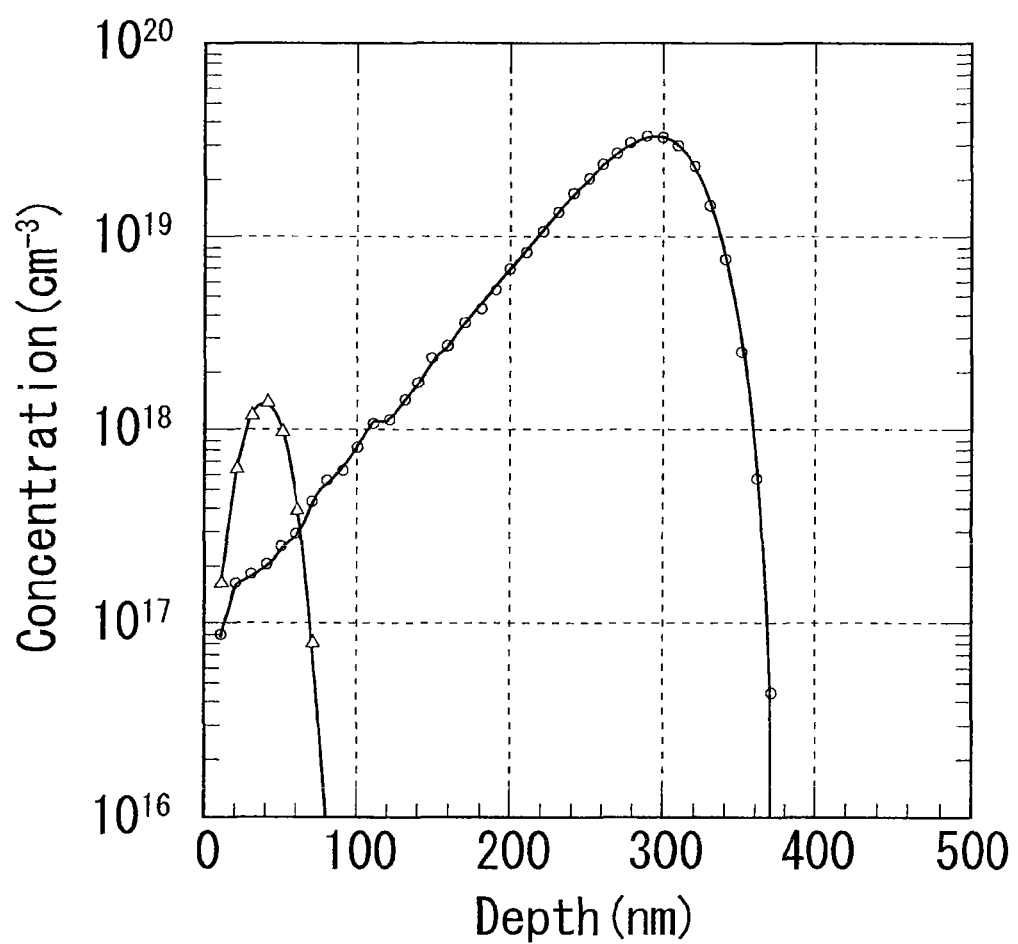

F I G . 2 2
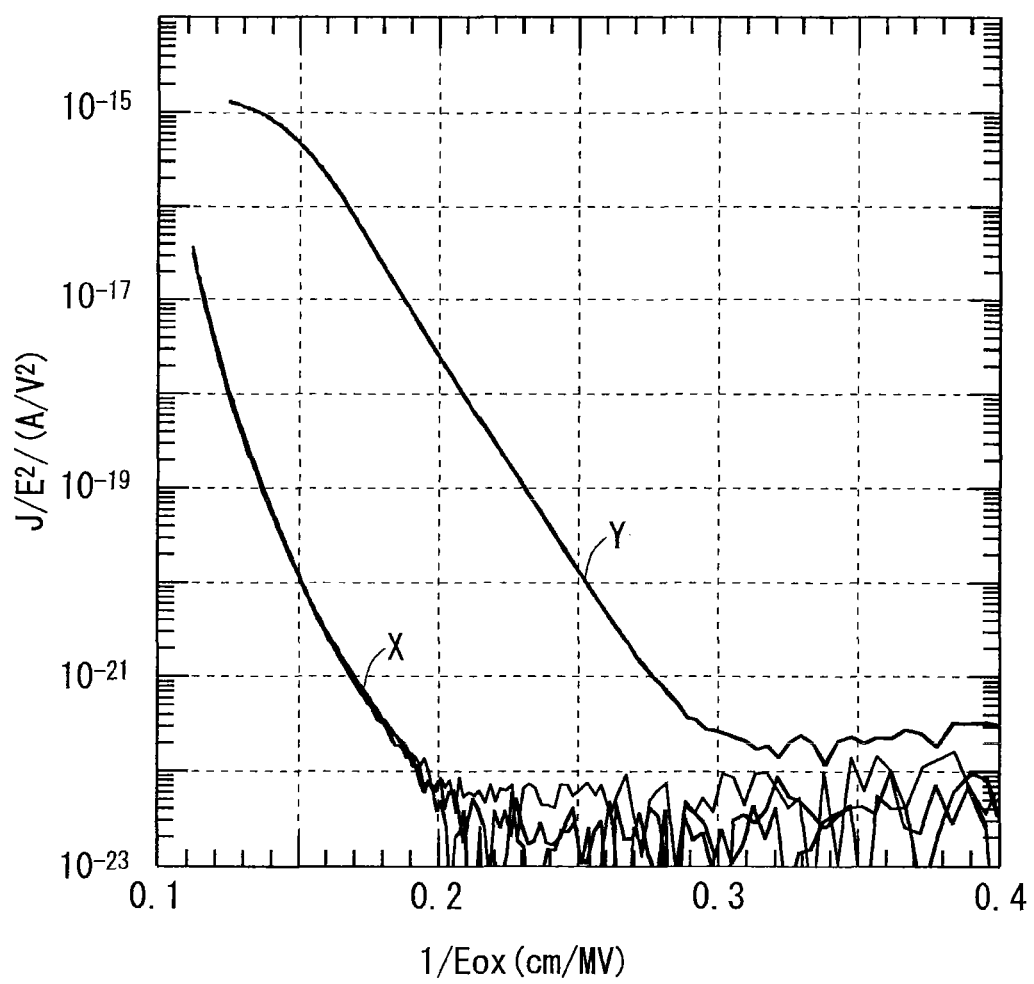

F I G . 2 3
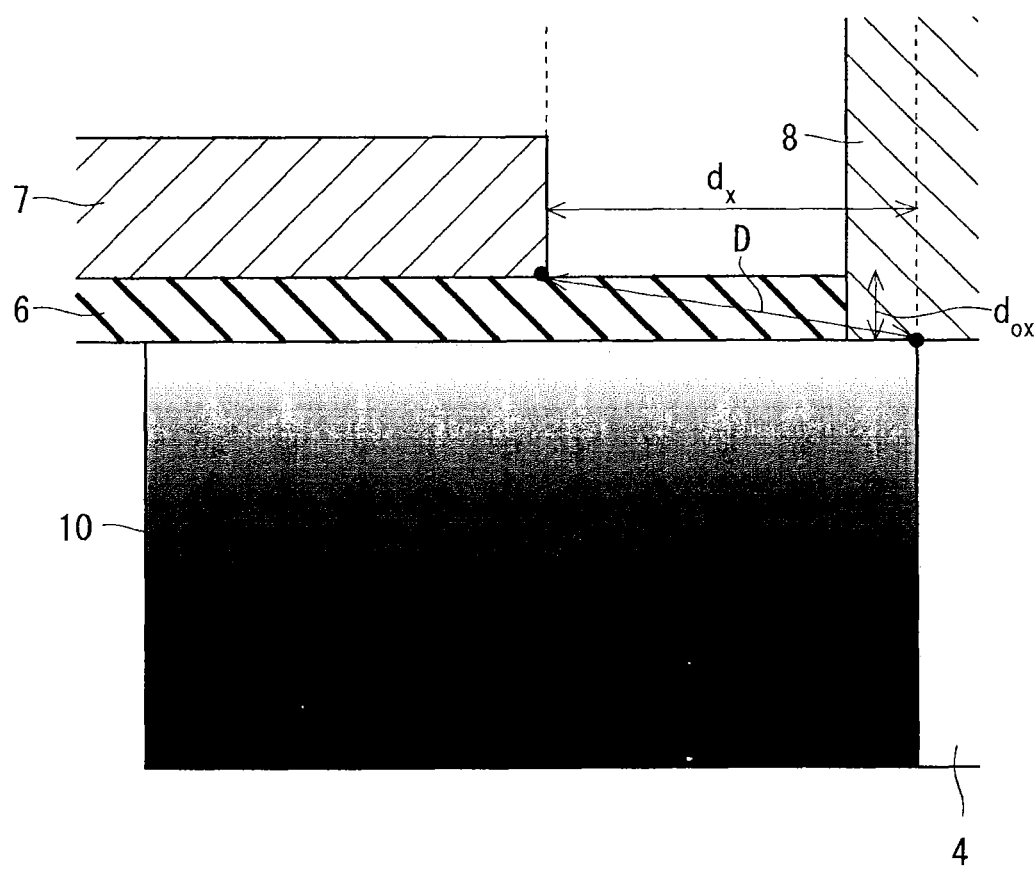

SILICON CARBIDE SEMICONDUCTOR DEVICE AND METHOD FOR MANUFACTURING SILICON CARBIDE SEMICONDUCTOR DEVICE

TECHNICAL FIELD

The present invention relates to a silicon carbide semiconductor device, and a method for manufacturing a silicon carbide semiconductor device.

BACKGROUND ART

In order to overcome a limitation in the physical properties of a power device including silicon, a power device including silicon carbide instead of silicon is under development, and particularly, an improvement in the reliability of the gate of a MOSFET including silicon carbide is demanded.

For example, a vertical type power MOSFET including silicon carbide, as disclosed in Patent Document 1, is structured such that a source region is doped with an n-type dopant at a high concentration and is in direct contact with a gate insulating film.

An example of a silicon carbide MOSFET, as in Patent Document 2, is disclosed in which the concentration of an n-type dopant is set lower only in the vicinity of an upper surface of a source region that is in contact with a gate insulating film. In this case, to achieve a successful ohmic contact with the source region doped with the n-type dopant, a source electrode is formed in an area where a trench is engraved.

PRIOR-ART DOCUMENTS

Patent Documents

Patent Document 1: Japanese Patent Application Laid-Open No. 2008-192691
Patent Document 2: Japanese Patent Application Laid-Open No. 2009-182271

SUMMARY OF THE INVENTION

Problems to be Solved by the Invention

Applying a high positive voltage to a gate electrode of a MOSFET may cause a gate current to flow through a gate insulating film. This is because conduction electrons at the semiconductor side tunnel through a barrier that is formed against the gate insulating film and flow into the gate electrode side.

Additionally, in the MOSFET including silicon carbide, even a relatively low voltage may cause the gate current having a high density to flow. This is because barrier energy between the gate insulating film and silicon carbide is lower than the barrier energy between the gate insulating film and silicon or the like. This tendency is more significant in an n-type source region. This causes a problem of a reduced reliability of a gate.

The present invention is made to solve the above-described problems, and an object of the present invention is to provide a silicon carbide semiconductor device that is able to increase the reliability with suppression of a gate current, and to provide a method for manufacturing the silicon carbide semiconductor device.

Means for Solving the Problems

A first silicon carbide semiconductor device according to the present invention includes: a drift layer having a first conductivity type and made of silicon carbide; a base region having a second conductivity type and selectively formed in a superficial layer of the drift layer; a source region having the first conductivity type and selectively formed in a superficial layer of the base region; a source electrode selectively formed on the source region; a gate insulating film formed so as to extend over the drift layer, the base region, and an area of the source region where the source electrode is not formed; and a gate electrode formed on the gate insulating film. The source region includes a first source region and a second source region, the first source region being arranged below the source electrode, the second source region being arranged below the gate electrode and formed so as to surround the first source region in a plan view. A doping concentration in a superficial layer of the second source region is lower than a doping concentration in a superficial layer of the first source region. A doping concentration in the second source region is higher in a deep portion than in a superficial portion thereof.

A second silicon carbide semiconductor device according to the present invention includes: a drift layer having a first conductivity type and made of silicon carbide; a base region having a second conductivity type and selectively formed in a superficial layer of the drift layer; a source region selectively formed in a superficial layer of the base region; a source electrode selectively formed on the source region; a gate insulating film formed so as to extend over the drift layer, the base region, and an area of the source region where the source electrode is not formed; and a gate electrode formed on the gate insulating film. The source region includes an upper-layer region and a lower-layer region, the upper-layer region having the second conductivity type and formed in a superficial portion, the lower-layer region having the first conductivity type and formed in a lower layer below the upper-layer region. The source electrode has a lower end thereof buried in the source region so as to reach the lower-layer region.

A first method for manufacturing a silicon carbide semiconductor device according to the present invention includes the steps of: (a) forming a drift layer having a first conductivity type and made of silicon carbide; (b) selectively forming a base region in a superficial layer of the drift layer, the base region having a second conductivity type; (c) selectively forming a source region in a superficial layer of the base region, the source region having the first conductivity type and including a first source region and a second source region that is formed so as to surround the first source region in a plan view; (d) forming a gate insulating film so as to extend over the drift layer, the base region, and the source region; (e) forming a gate electrode on the gate insulating film such that the gate electrode extends from the superficial layer of the drift layer to a superficial layer of the second source region; and (f) etching and removing a portion of the gate insulating film at a position corresponding to the first source region, and forming a source electrode on the first source region. A doping concentration in the superficial layer of the second source region is lower than a doping concentration in a superficial layer of the first source region. A doping concentration in the second source region is higher in a deep portion than in a superficial portion thereof.

A second method for manufacturing a silicon carbide semiconductor device according to the present invention includes the steps of: (a) forming a drift layer having a first conductivity type and made of silicon carbide; (b) selectively forming a base region in a superficial layer of the drift layer, the base region having a second conductivity type; (c) selectively forming a source region in a superficial layer of the base region, the source region including an upper-layer region having the second conductivity type and formed in a superficial portion and a lower-layer region having the first conductivity type and formed in a lower layer below the upper-layer region; (d) forming a gate insulating film so as to extend over the drift layer, the base region, and the source region; (e) forming a gate electrode on the gate insulating film such that the gate electrode extends from the superficial layer of the drift layer into a superficial layer of the source region; (f) forming a trench that extends from an area of a surface of the gate insulating film where the gate electrode is not formed and reaches the lower-layer region; and (g) forming a source electrode such that a lower end thereof is buried in the trench.

Effects of the Invention

The first silicon carbide semiconductor device according to the present invention includes: a drift layer having a first conductivity type and made of silicon carbide; a base region having a second conductivity type and selectively formed in a superficial layer of the drift layer; a source region having the first conductivity type and selectively formed in a superficial layer of the base region; a source electrode selectively formed on the source region; a gate insulating film formed so as to extend over the drift layer, the base region, and an area of the source region where the source electrode is not formed; and a gate electrode formed on the gate insulating film. The source region includes a first source region and a second source region, the first source region being arranged below the source electrode, the second source region being arranged below the gate electrode and formed so as to surround the first source region in a plan view. A doping concentration in a superficial layer of the second source region is lower than a doping concentration in a superficial layer of the first source region. A doping concentration in the second source region is higher in a deep portion than in a superficial portion thereof. Thereby, a gate current can be suppressed. Thus, the reliability of the gate is improved.

The second silicon carbide semiconductor device according to the present invention includes: a drift layer having a first conductivity type and made of silicon carbide; a base region having a second conductivity type and selectively formed in a superficial layer of the drift layer; a source region selectively formed in a superficial layer of the base region; a source electrode selectively formed on the source region; a gate insulating film formed so as to extend over the drift layer, the base region, and an area of the source region where the source electrode is not formed; and a gate electrode formed on the gate insulating film. The source region includes an upper-layer region and a lower-layer region, the upper-layer region having the second conductivity type and formed in a superficial portion, the lower-layer region having the first conductivity type and formed in a lower layer below the upper-layer region. The source electrode has a lower end thereof buried in the source region so as to reach the lower-layer region. Thereby, a gate current can be suppressed. Thus, the reliability of the gate is improved.

The first method for manufacturing a silicon carbide semiconductor device according to the present invention includes the steps of: (a) forming a drift layer having a first conductivity type and made of silicon carbide; (b) selectively forming a base region in a superficial layer of the drift layer, the base region having a second conductivity type; (c) selectively forming a source region in a superficial layer of the base region, the source region having the first conductivity type and including a first source region and a second source region that is formed so as to surround the first source region in a plan view; (d) forming a gate insulating film so as to extend over the drift layer, the base region, and the source region; (e) forming a gate electrode on the gate insulating film such that the gate electrode extends from the superficial layer of the drift layer to a superficial layer of the second source region; and (f) etching and removing a portion of the gate insulating film at a position corresponding to the first source region, and forming a source electrode on the first source region. A doping concentration in the superficial layer of the second source region is lower than a doping concentration in a superficial layer of the first source region. A doping concentration in the second source region is higher in a deep portion than in a superficial portion thereof. Thereby, a gate current can be suppressed. Thus, the reliability of the gate is improved.

The second method for manufacturing a silicon carbide semiconductor device according to the present invention includes the steps of: (a) forming a drift layer having a first conductivity type and made of silicon carbide; (b) selectively forming a base region in a superficial layer of the drift layer, the base region having a second conductivity type; (c) selectively forming a source region in a superficial layer of the base region, the source region including an upper-layer region having the second conductivity type and formed in a superficial portion and a lower-layer region having the first conductivity type and formed in a lower layer below the upper-layer region; (d) forming a gate insulating film so as to extend over the drift layer, the base region, and the source region; (e) forming a gate electrode on the gate insulating film such that the gate electrode extends from the superficial layer of the drift layer into a superficial layer of the source region; (f) forming a trench that extends from an area of a surface of the gate insulating film where the gate electrode is not formed and reaches the lower-layer region; and (g) forming a source electrode such that a lower end thereof is buried in the trench. Thereby, a gate current can be suppressed. Thus, the reliability of the gate is improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 A cross-sectional view showing a silicon carbide semiconductor device according to an embodiment 1 of the present invention.

FIG. 4 A diagram showing the step of forming a source region in the method for manufacturing the silicon carbide semiconductor device according to the embodiment 1 of the present invention.

FIG. 5 A diagram showing the step of forming a contact region in the method for manufacturing the silicon carbide semiconductor device according to the embodiment 1 of the present invention, FIG. 6 A diagram showing the step of forming a gate insulating film in the method for manufacturing the silicon carbide semiconductor device according to the embodiment 1 of the present invention.

FIG. 20 A diagram showing a profile of N-implantation and Al-implantation in a source region and in a p-type region in the method for manufacturing the silicon carbide semiconductor device according to the embodiment 2 of the present invention.

FIG. 22 A diagram showing an FN current that is caused to flow upon application of a positive bias in the silicon carbide semiconductor device according to the embodiment 1 of the present invention.

FIG. 23 A cross-sectional view showing the silicon carbide semiconductor device according to the embodiment 1 of the present invention.

EMBODIMENT FOR CARRYING OUT THE INVENTION

A. Embodiment 1

<A-1. Configuration>

Figure 2:
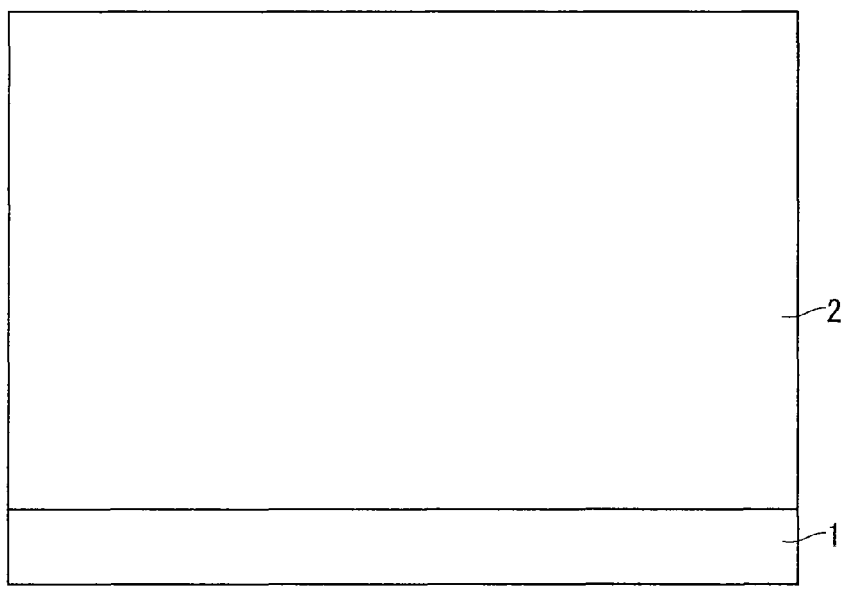
FIG. 2 A diagram showing the step of forming a drift layer in a method for manufacturing the silicon carbide semiconductor device according to the embodiment 1 of the present invention.

FIG. 1 is a cross-sectional view showing a silicon carbide semiconductor device according to an embodiment 1 of the present invention. In the description of this embodiment, a first conductivity type is n-type and a second conductivity type is p-type.

The silicon carbide semiconductor device is, for example, a silicon carbide MOSFET of n-channel vertical type in which its main surface has a plane orientation of (0001) plane and an n-type drift layer 2 made of silicon carbide is formed on a main surface of an n-type silicon carbide substrate 1 of 4H polytype having a low resistance, as shown in FIG. 1.

A p-type base region 3 containing, for example, Al as a p-type impurity is selectively formed in a superficial portion of the drift layer 2. As shown in FIG. 1, a plurality of the base regions 3 can be formed apart from one another. In the base region 3, an n-type second source region 10 containing, for example, N as an n-type impurity is selectively formed. Inside the base region 3, an n-type first source region 4 is further formed. The first source region 4 and the second source region 10 jointly form a source region.

Figure 10:
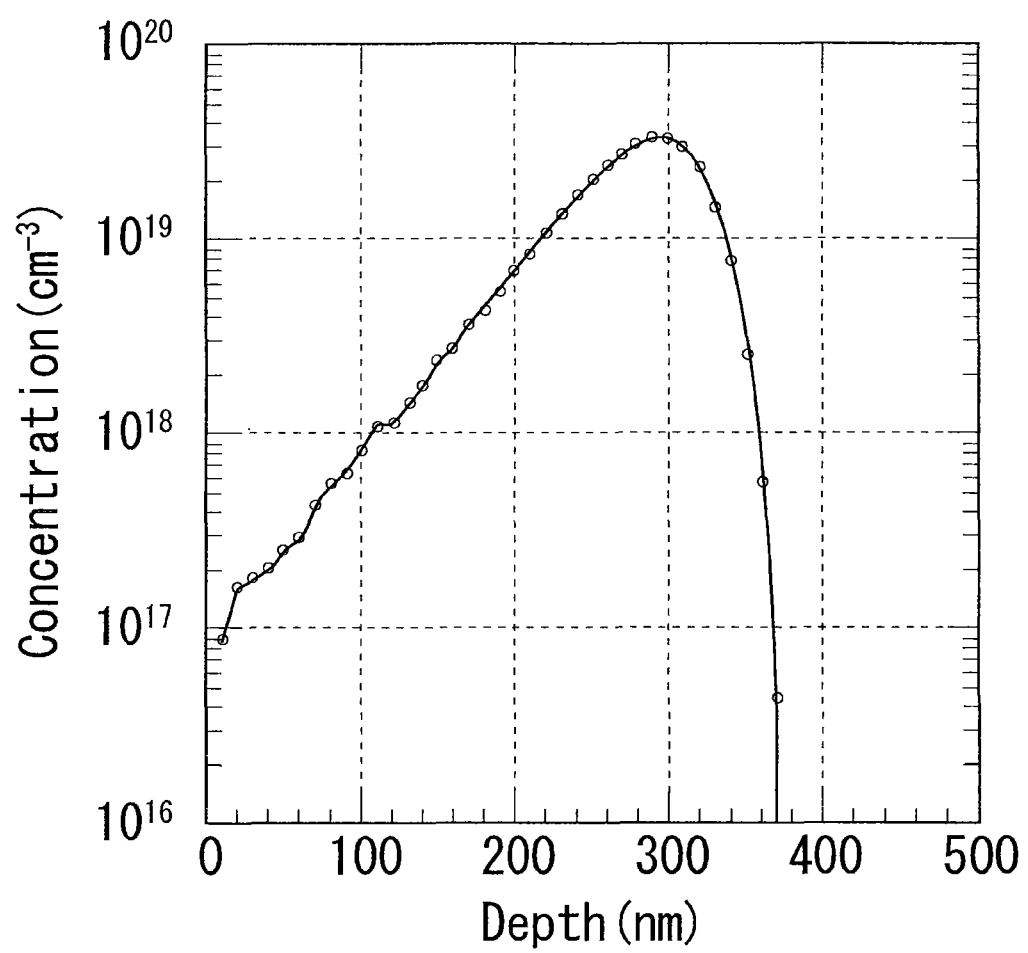
FIG. 10 A diagram showing a profile of N-implantation in a second source region in the method for manufacturing the silicon carbide semiconductor device according to the embodiment 1 of the present invention.

The first source region 4 is implanted with N with a box profile. The second source region 10 is implanted with N with a profile as shown in FIG. 10. FIG. 10 shows a profile of the second source region 10, with its horizontal axis representing the depth (nm) and its vertical axis representing the concentration ($cm^{-3}$). As shown in FIG. 10, the second source region 10 has such a profile that the concentration is higher in a deeper portion than in the superficial portion. The second source region 10 is formed such that the concentration reaches its peak at a location having a depth of about 300 nm.

A p-type contact region 5 containing, for example, Al as a p-type impurity with an impurity concentration higher than that in the base region 3 is formed in the first source region 4. A source electrode 8 is formed in ohmic contact on the first source region 4 and the contact region 5.

A gate insulating film 6 made of silicon oxide is formed on a surface of the drift layer 2 except where the source electrode 8 is formed. On the gate insulating film 6, a gate electrode 7 is provided so as to extend over the boundary between the second source region 10 and the base region 3.

A drain electrode 9 is formed on a surface of the silicon carbide substrate 1 opposite to the main surface thereof.

<A-2. Manufacturing Method>

Next, an example of a method for manufacturing the silicon carbide semiconductor device according to this embodiment will be described with reference to FIGS. 2 to 10.

Firstly, through a thermal CVD (Chemical Vapor Deposition) process, a drift layer 2 made of silicon carbide with a thickness of 1 to 100 μm is epitaxially grown on a surface of the n-type silicon carbide substrate 1 of 4H polytype whose main surface has a plane orientation of (0001) plane, as shown in FIG. 2. The thermal CVD process is performed under the condition of, for example, temperature: 1500 to 1800° C., atmospheric pressure: 25 MPa, carrier gas species: $H_2$, and generated gas species: $SiH_4$ and $C_3H_8$.

Figure 3:
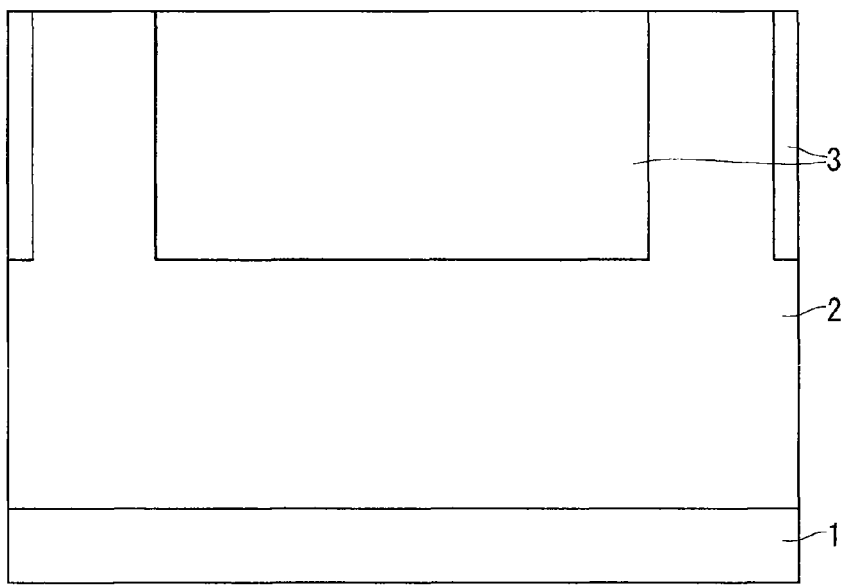
FIG. 3 A diagram showing the step of forming a base region in the method for manufacturing the silicon carbide semiconductor device according to the embodiment 1 of the present invention.

Then, a mask made of a resist is formed on the drift layer 2, and, for example, Al which is a p-type impurity is ion-implanted with interposition of the mask. Thereby, the base regions 3 are selectively formed as shown in FIG. 3. The depth of implantation of Al is 0.5 to 3.0 μm, and the concentration of implantation is $1\times10^{16}$ to $1\times10^{19}$ $cm^{-3}$.

After the mask is removed, a new mask made of a resist is formed on the drift layer 2, and N which is an n-type impurity is ion-implanted with interposition of the mask. Thereby, the first source region 4 is formed as shown in FIG. 4. At this time, the process is performed such that the first source region 4 forms a superficial layer of the base region 3. The implantation of N exhibits a box profile, and the depth of implantation is, for example, 0.05 to 1.5 μm and the concentration of implantation is, for example, $1 \times 10^{19}$ to $1 \times 10^{21}$ cm$^{-3}$.

After the mask is removed, a new mask made of a resist is formed on the drift layer 2, and N which is an n-type impurity is ion-implanted with interposition of the mask. Thereby, the second source region 10 is formed as shown in FIG. 4. At this time, the process is performed such that the second source region 10 is formed outside the first source region 4 and selectively formed in the base region 3. The profile of the implantation of N can be the one as shown in FIG. 10, and the peak concentration of implantation is, for example, $1 \times 10^{19}$ to $1 \times 10^{21}$ cm$^{-3}$. In a region of the second source region 10 ranging from the superficial layer to the 100 nm depth, the doping concentration is desirably lower than the doping concentration in the superficial layer of the first source region 4, and to be specific, it is desirable that the doping concentration is, for example, $1 \times 10^{16}$ to $1 \times 10^{18}$ cm$^{-3}$.

After the mask is removed, a new mask made of a resist or silicon oxide is formed on the drift layer 2, and Al which is a p-type impurity is ion-implanted with interposition of the mask. Thereby, the contact region 5 is formed as shown in FIG. 5. At this time, the process is performed such that the contact region 5 is formed within the first source region 4. The depth of implantation of Al is 0.05 to 1.5 μm, and the concentration of implantation is $1 \times 10^{19}$ to $1 \times 10^{21}$ cm$^{-3}$.

Then, the mask is removed, and activation annealing is performed under an inert gas atmosphere and in a temperature range of 1300 to 2100° C. This electrically activates the base region 3, the first source region 4, the second source region 10, and the contact region 5 that are formed in a superficial layer of the drift layer 2.

Then, a thermal oxidation film is formed on a surface of the drift layer 2 at 800 to 1400° C., and is removed by using hydrofluoric acid (sacrificial oxidation process).

Figure 6:
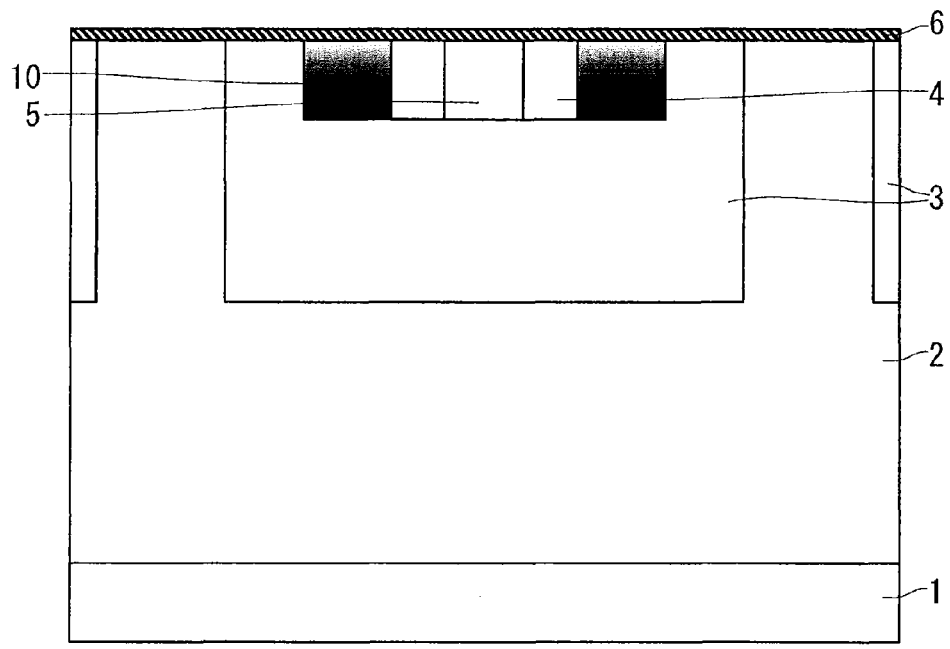

Then, as shown in FIG. 6, the surface of the drift layer 2 is thermally oxidized, so that the gate insulating film 6 having a desired thickness is formed.

Figure 7:
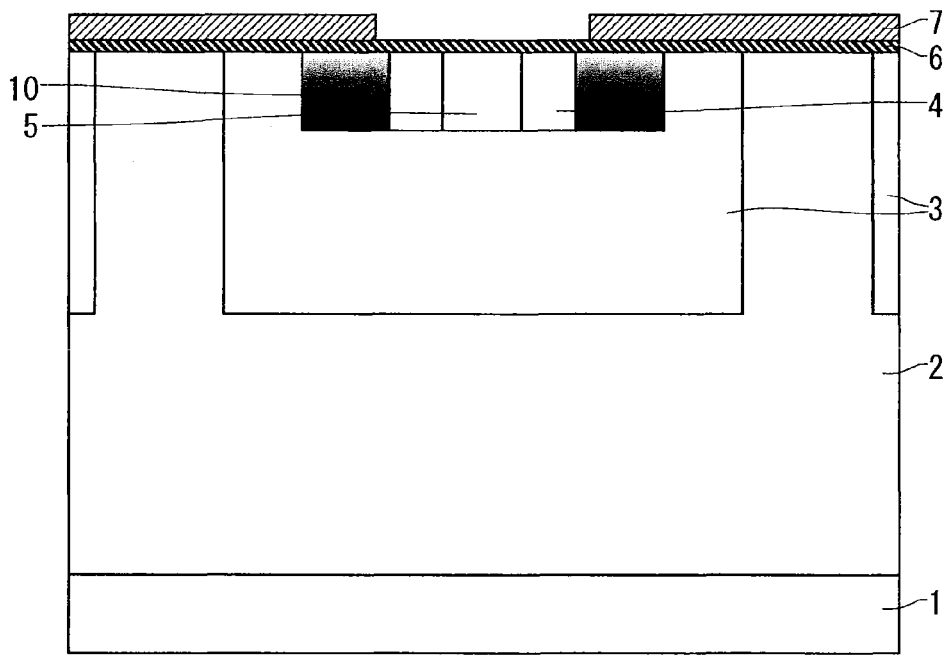
FIG. 7 A diagram showing the step of forming a gate electrode in the method for manufacturing the silicon carbide semiconductor device according to the embodiment 1 of the present invention.

Then, as shown in FIG. 7, a polycrystalline silicon film having conductive properties is formed on the gate insulating film 6 through a low-pressure CVD process, and the gate electrode 7 is formed by using a lithography technique and an etching technique. The material of the gate electrode 7 is not limited to polycrystalline silicon, but may be any of nickel (Ni), titanium (Ti), aluminum (Al), molybdenum (Mo), chromium (Cr), platinum (Pt), tungsten (W), silicon (Si), titanium carbide (TiC), or alloys thereof.

Figure 8:
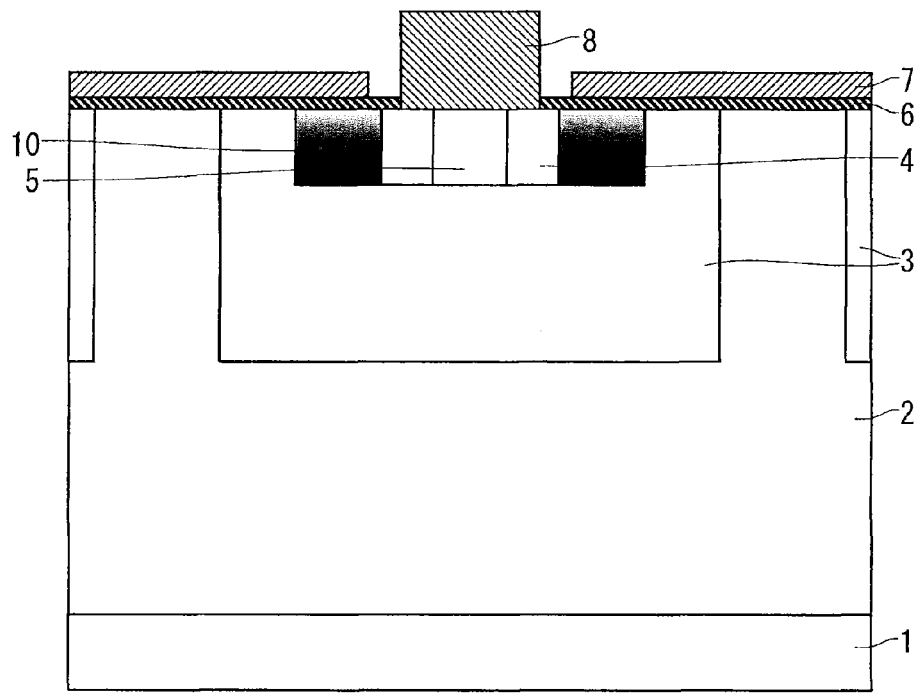
FIG. 8 A diagram showing the step of forming a source electrode in the method for manufacturing the silicon carbide semiconductor device according to the embodiment 1 of the present invention.

Then, as shown in FIG. 8, a portion of the gate insulating film 6 above a region where the first source region 4 and the contact region 5 are formed is removed by using a lithography technique and an etching technique, and Ni layers are formed within a resulting opening, to form the source electrode 8 that is electrically in ohmic connection with both the first source region 4 and the contact region 5. Here, the material of the source electrode 8 is not limited to Ni, but may be any of Ti, Al, Mo, Cr, Pt, W, Si, TiC, or alloys thereof.

Figure 9:
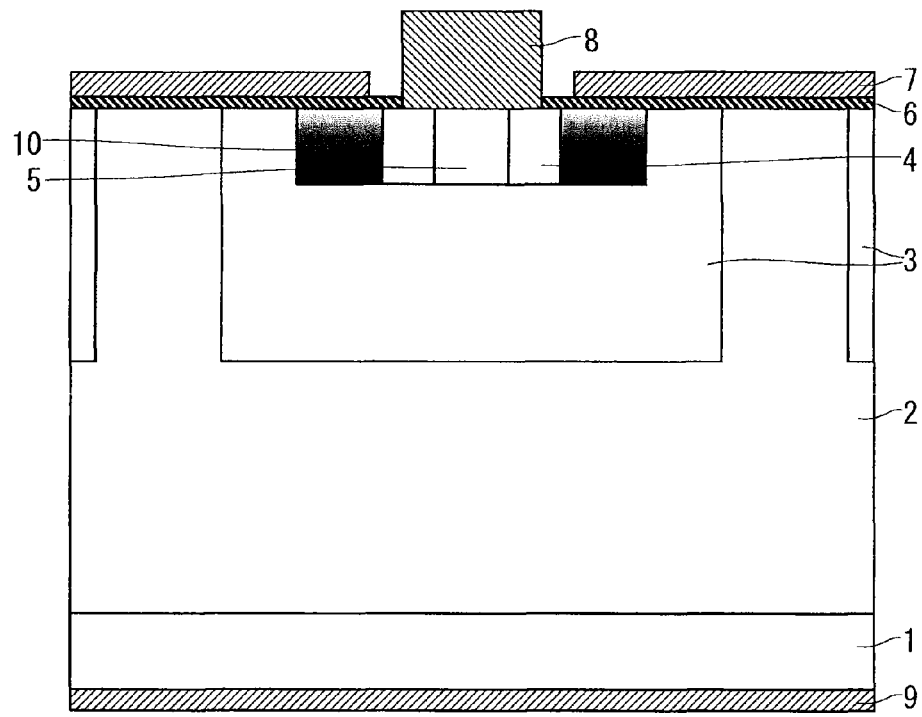
FIG. 9 A diagram showing the step of forming a drain electrode in the method for manufacturing the silicon carbide semiconductor device according to the embodiment 1 of the present invention.

Then, as shown in FIG. 9, the drain electrode 9 is formed throughout a surface of the silicon carbide substrate 1 opposite to the main surface thereof. The material of the drain electrode 9 may be, similarly to the material of the source electrode 8, any of Ni, Ti, Al, Mo, Cr, Pt, W, Si, TiC, or alloys thereof.

Finally, a heat treatment is performed for alloying, with silicon carbide, a portion where the source electrode 8 is in contact with the first source region 4 and the contact region 5 and a portion where the drain electrode 9 is in contact with the silicon carbide substrate 1. This heat treatment is performed under the condition of, for example, temperature: 950 to 1000° C., processing time: 20 to 60 sec, and speed of temperature rise: 10 to 25° C./sec.

Through the above-described process, the silicon carbide semiconductor device according to this embodiment is completed.

In the silicon carbide semiconductor device illustrated in this embodiment, the gate electrode 7 is not arranged immediately above the first source region 4. This can suppress occurrence of FN (Fowler-Nordheim) tunneling of conduction electrons of the n-type first source region 4 to the gate insulating film 6 side at a time of application of a positive bias to the gate. Thus, the reliability of the gate is improved.

In the n-type first source region 4 that is in contact with the source electrode 8, including a portion near the upper surface thereof, the doping is performed uniformly at a high concentration. Therefore, a good ohmic contact can be obtained.

Figure 21:
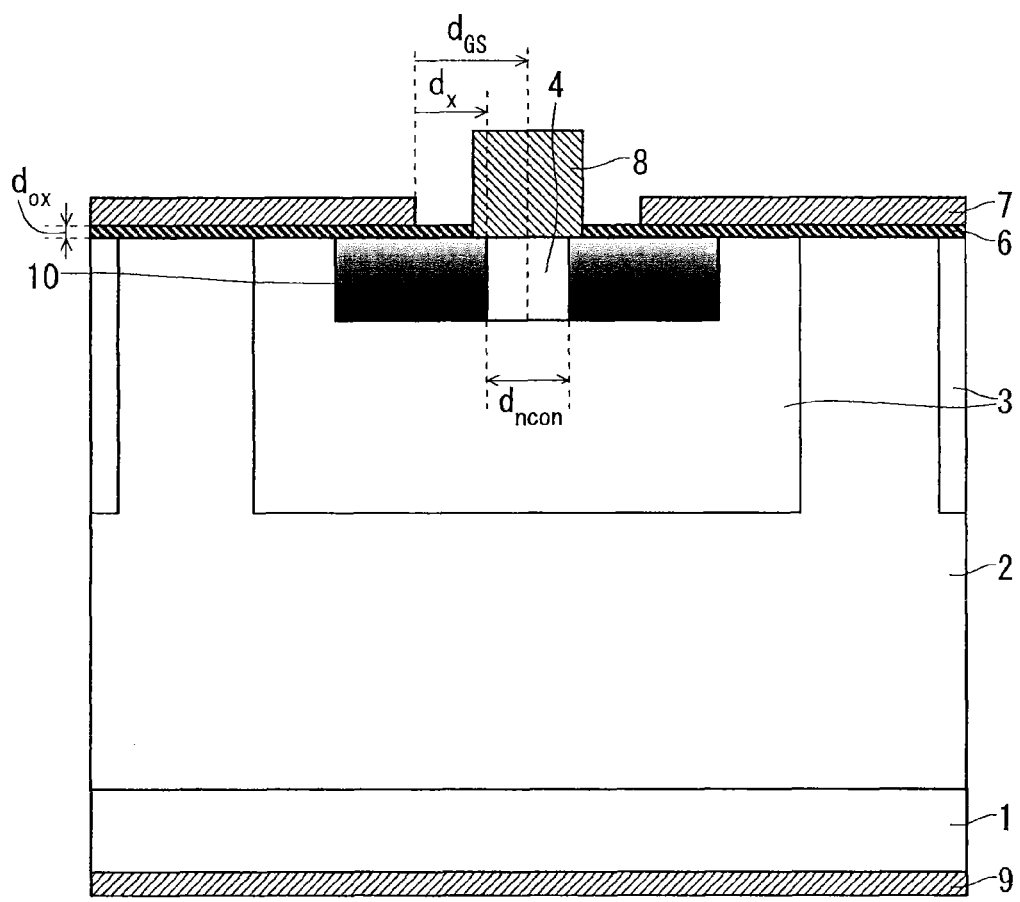
FIG. 21 A cross-sectional view showing the silicon carbide semiconductor device according to the embodiment 1 of the present invention.

Here, the horizontal arrangement positions of the first source region 4 and the n-type second source region 10 will be described with reference to FIG. 21. FIG. 21 is a cross-sectional view showing a silicon carbide semiconductor device. Referring to FIG. 21, the right end (at the source electrode 8 side) of left one of the gate electrodes 7 that are formed apart from each other is defined as the origin of the horizontal coordinate axis. This origin is an origin set for convenience of the description.

The distance from the origin to the right end of the second source region 10 (that is, the boundary with the first source region 4) is defined as a distance $d_X$. The distance from the origin to the center of the source electrode 8 is defined as a distance $d_{GS}$. The horizontal width of the first source region 4 is defined as a horizontal width $d_{ncon}$. The vertical thickness of the gate insulating film 6 is defined as a thickness $d_{OX}$. In FIG. 21, for simplification of the description, the contact region 5 is not shown.

In a case where the distance $d_X$ is 0 μm, the first source region 4 having a high concentration does not exist immediately below the gate electrode 7. However, it is necessary that the distance $d_X$ is greater than 0 μm, because an electric field ranges obliquely, too, from the gate electrode 7 toward the silicon carbide layer through the gate insulating film 6.

FIG. 22 shows graphs plotting an FN current that flows upon application of a positive bias to the gate electrode 7 under a state where the silicon carbide side is grounded in an MOS capacitor in which the gate insulating film 6 or the gate electrode 7 is provided on the first source region 4 or the second source region 10. In FIG. 22, Eox represents an electric field applied to the gate insulating film 6, and J represents the current density.

In a case where the MOS capacitor is prepared in which the gate insulating film 6 and the gate electrode 7 are provided on the second source region 10, the FN current is caused to flow when the electric field is equal to or more than about 5 MV/cm (see X in FIG. 22).

On the other hand, in a case where the MOS capacitor is prepared in which the gate insulating film 6 and the gate electrode 7 are provided on the first source region 4, the FN current starts to flow when the electric field is equal to or more than about 3 MV/cm (see Y in FIG. 22).

From the above, it is revealed that an electric field that causes a current leakage to occur on the first source region 4 is only 3/5 of the electric field that causes a current leakage to occur on the second source region 10. Accordingly, under the condition that the same voltage is applied, it is necessary that a thickness D of the gate insulating film 6 is 5/3 times the thickness $d_{OX}$ at a location above the first source region 4. Here, it suffices that the thickness D of the gate insulating film 6 that is substantially interposed between the first source region 4 and the gate electrode 7 is 5/3 times the thickness $d_{OX}$. Therefore, it is not always necessary that the vertical thickness of the gate insulating film 6 is 5/3 times the thickness $d_{OX}$.

FIG. 23 is a diagram showing, on an enlarged scale, a part of the cross-sectional view of the silicon carbide semiconductor device shown in FIG. 21.

Considering the thickness D of the gate insulating film 6 that is substantially interposed between the first source region 4 and the gate electrode 7, a right triangle whose hypotenuse is defined by the thickness D is assumed, as shown in FIG. 23. The vertical side and the horizontal side of the right triangle are defined by the thickness $d_{OX}$ and the distance $d_X$, respectively.

Referring to the right triangle, it is found that, when the thickness D is greater than 5/3 times the thickness $d_{OX}$, the distance $d_X$ is greater than at least 4/3 times the thickness $d_{OX}$.

Therefore, it is necessary that the distance $d_X$ satisfies $$d_X > 4d_{OX}/3.$$

On the other hand, in order to reliably obtain an ohmic contact of the n-source, it is necessary that a sufficient area is ensured for an ohmic-contact region to ensure that the value of a contact resistance of the entire element is less than the value of an on-resistance of the element.

In a case where the horizontal width $d_{ncon}$ of the first source region 4 is smaller than the horizontal width of the source electrode 8, it is desirable to satisfy $$\rho c/(d_{ncon}^2 \times N) < R/S,$$

where $d_{ncon}^2$ represents the area of the first source region 4; N represents the number of cells included in the element; S represents the area of an active region of the element; $\rho c$ represents the ohmic contact resistivity; and R represents the on-resistivity of the element.

Translating this expression based on the relationship shown in FIG. 21 results in $d_X < d_{GS} - 0.5 \times (\rho cS/RN)^{1/2}$, because $d_{GS} + 0.5 \times d_{ncon} = d_X + d_{ncon}$.

In a case where the horizontal width of the contact region 5 is the horizontal width $d_{pcon}$, the above-mentioned expression is further translated into $$d_X < d_{GS} + d_{pcon}/2 - 0.5 \times (\rho cS/RN + d_{pcon}^2)^{1/2}.$$

Accordingly, it is desirable that $d_X$ satisfies $$4d_{OX}/3 < d_X < d_{GS} + d_{pcon}/2 - 0.5 \times (\rho cS/RN + d_{pcon}^2)^{1/2}.$$

<A-3. Effects>

In the embodiment of the present invention, the silicon carbide semiconductor device includes: the drift layer 2 having the first conductivity type and made of silicon carbide; the base region 3 having the second conductivity type and selectively formed in the superficial layer of the drift layer 2; the source region having the first conductivity type and selectively formed in the superficial layer of the base region 3; the source electrode 8 selectively formed on the source region; the gate insulating film 6 formed so as to extend over the drift layer 2, the base region 3, and an area of the source region where the source electrode 8 is not formed; and the gate electrode 7 formed on the gate insulating film 6. The source region includes: the first source region 4 arranged below the source electrode 8; and the second source region 10 arranged below the gate electrode 7 and formed so as to surround the first source region 4 in a plan view. The doping concentration in the superficial layer of the second source region 10 is lower than the doping concentration in the superficial layer of the first source region 4, and the doping concentration in the second source region 10 is higher in a deep portion than in a superficial portion thereof. This can suppress occurrence of FN tunneling of conduction electrons of the n-type first source region 4 to the gate insulating film 6 side. Thus, the reliability of the gate is improved.

Additionally, setting the doping concentration in the superficial layer side to be lower and increasing the doping concentration as the depth increases can prevent an increase in the on-resistance with suppression of occurrence of FN tunneling.

In the embodiment of the present invention, in the silicon carbide semiconductor device, the doping concentration in the region of the second source region 10 ranging from the superficial layer to the 100 nm depth is lower than the doping concentration in the superficial layer of the first source region 4. Accordingly, the doping concentration in the superficial layer of the second source region 10 located below the gate insulating film 6 is low. Thus, occurrence of FN tunneling can be suppressed.

In the embodiment of the present invention, in the silicon carbide semiconductor device, the doping concentration in the region of the second source region 10 ranging from the superficial layer to the 100 nm depth is $1 \times 10^{16}$ to $1 \times 10^{18}$ cm$^{-3}$, and therefore the doping concentration in the superficial layer of the second source region 10 located below the gate insulating film 6 is low. Thus, occurrence of FN tunneling can be suppressed.

In the embodiment of the present invention, in the silicon carbide semiconductor device, the doping concentration in the superficial layer of the first source region 4 is $1 \times 10^{19}$ to $1 \times 10^{21}$ cm$^{-3}$, and therefore it is not necessary to form a trench or the like, to obtain a good ohmic contact.

B. Embodiment 2

<B-1. Configuration>

Figure 11:
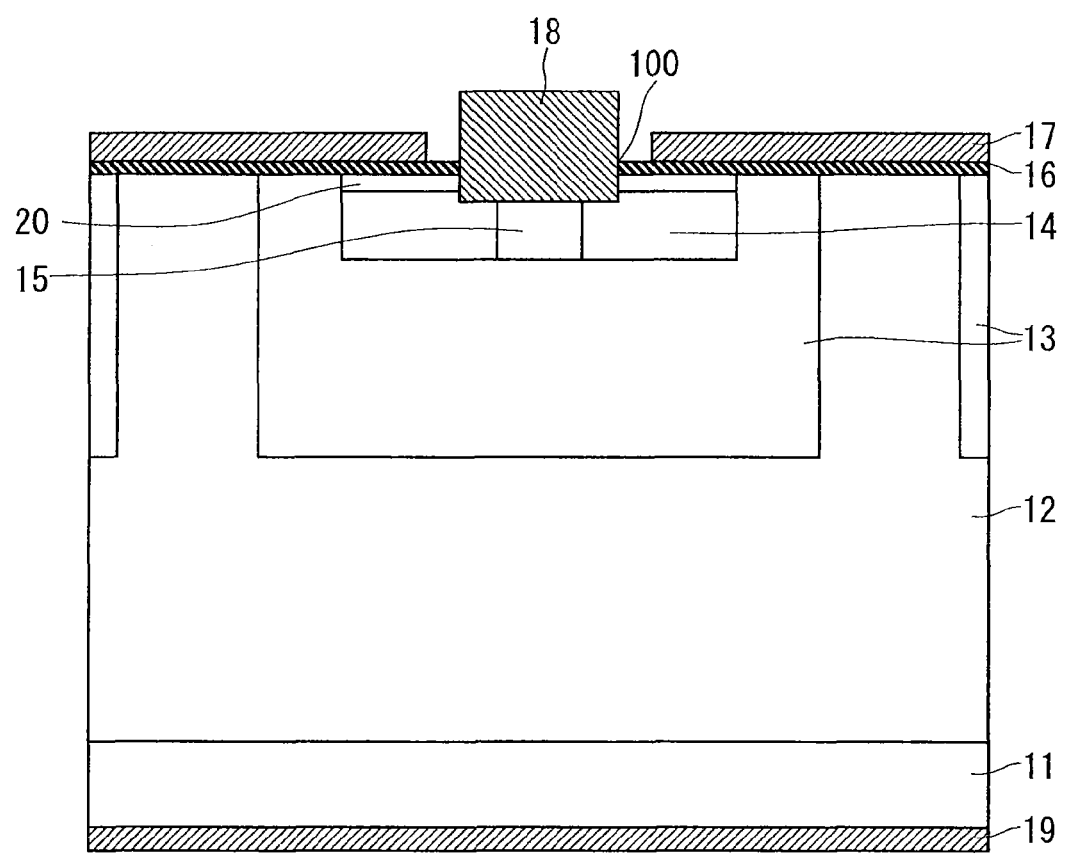
FIG. 11 A cross-sectional view showing a silicon carbide semiconductor device according to an embodiment 2 of the present invention.

FIG. 11 is a cross-sectional view showing a silicon carbide semiconductor device according to an embodiment 2 of the present invention. In the description of this embodiment, a first conductivity type is n-type and a second conductivity type is p-type.

The silicon carbide semiconductor device is, for example, a silicon carbide MOSFET of n-channel vertical type in which its main surface has a plane orientation of (0001) plane and an n-type drift layer 12 made of silicon carbide is formed on a main surface of an n-type silicon carbide substrate 11 of 4H polytype having a low resistance, as shown in FIG. 11.

A p-type base region 13 containing, for example, Al as a p-type impurity is selectively formed in a superficial portion of the drift layer 12. As shown in FIG. 11, a plurality of the base regions 13 can be formed apart from one another. Inside the base region 13, an n-type lower-layer source region 14 containing, for example, N as an n-type impurity is selectively formed.

A p-type region 20 serving as an upper-layer region containing, for example, Al as a p-type impurity is formed near an upper surface of the lower-layer source region 14 serving as a lower-layer region. The profiles of N-implantation and Al-implantation in the lower-layer source region 14 and the p-type region 20 are as shown in FIG. 20. The boundary between the lower-layer source region 14 and the p-type region 20 is located at a depth of 5 to 100 nm from the superficial layer of the source region, for example. Here, FIG. 20 shows the profile (circle points) in the lower-layer source region 14 and the profile (triangle points) in the p-type region 20. The horizontal axis represents the depth (nm), and the vertical axis represents the concentration ($cm^{-3}$). As shown in FIG. 20, the lower-layer source region 14 has such a profile that the concentration is higher in the deep portion than in the superficial portion, and the concentration reaches the peak at a depth of about 300 nm. The p-type region 20 has such a profile that the concentration reaches the peak at a depth of about 40 nm. The lower-layer source region 14 and the p-type region 20 jointly form a source region.

Forming them in this manner enables a conduction band of the p-type region 20 near the upper surface to be shifted to the high energy side due to band bending.

A p-type contact region 15 containing, for example, Al as a p-type impurity with an impurity concentration higher than that in the base region 13 is formed in the source region. A trench 100 is provided in a central portion of a region where the source region and the contact region 15 are formed. The trench 100 extends from a surface of the drift layer 12 to the lower-layer source region 14 and the contact region 15. A source electrode 18 is formed in the trench 100. The lower end of the source electrode 18, which reaches the lower-layer source region 14, is buried. The source electrode 18 is formed in ohmic contact with the lower-layer source region 14 and the contact region 15.

A gate insulating film 16 made of silicon oxide is formed on a surface of the drift layer 12 except where the source electrode 18 is formed. On the gate insulating film 16, a gate electrode 17 is provided so as to extend over the boundary between the p-type region 20 and the base region 13.

A drain electrode 19 is formed on a surface of the silicon carbide substrate 11 opposite to the main surface thereof.

<B-2. Manufacturing Method>

Next, an example of a method for manufacturing the silicon carbide semiconductor device according to this embodiment will be described with reference to FIGS. 12 to 20.

Figure 12:
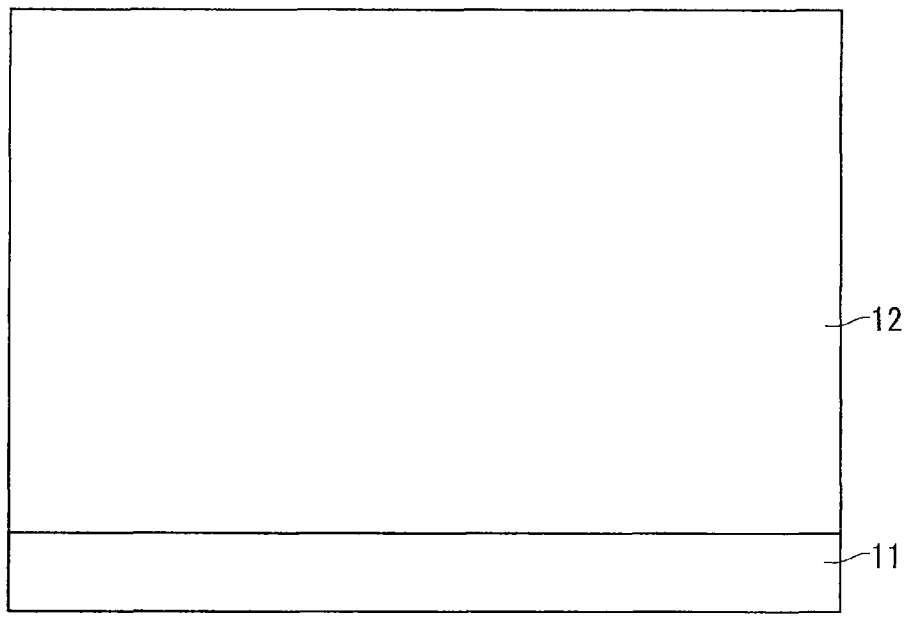
FIG. 12 A diagram showing the step of forming a drift layer in a method for manufacturing the silicon carbide semiconductor device according to the embodiment 2 of the present invention.

Firstly, through a thermal CVD (Chemical Vapor Deposition) process, a drift layer 12 made of silicon carbide with a thickness of 1 to 100 μm is epitaxially grown on a surface of the n-type silicon carbide substrate 11 of 4H polytype whose main surface has a plane orientation of (0001) plane, as shown in FIG. 12. The thermal CVD process is performed under the condition of, for example, temperature: 1500 to 1800° C., atmospheric pressure: 25 MPa, carrier gas species: $H_2$, and generated gas species: $SiH_4$ and $C_3H_8$.

Figure 13:
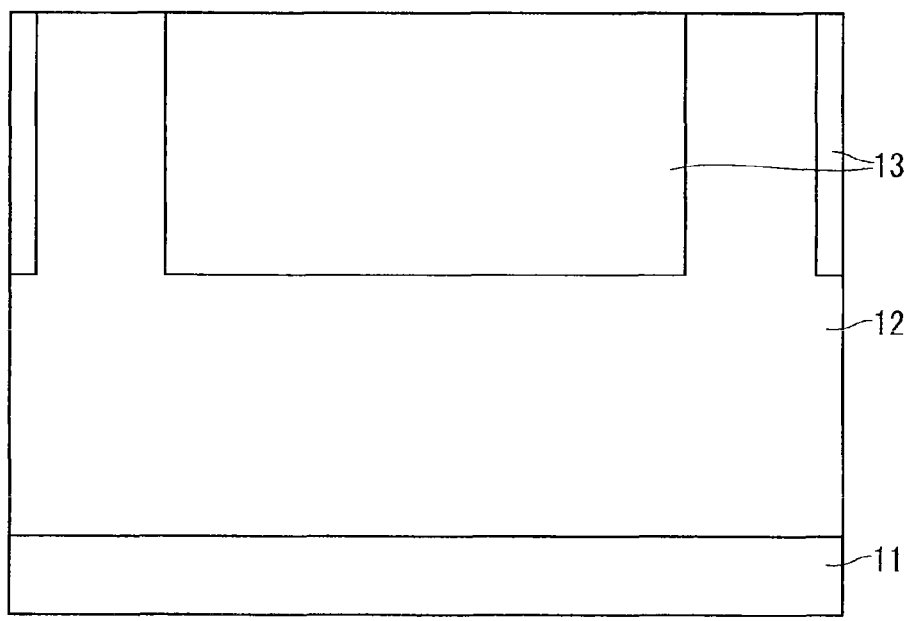
FIG. 13 A diagram showing the step of forming a base region in the method for manufacturing the silicon carbide semiconductor device according to the embodiment 2 of the present invention.

Then, a mask made of a resist is formed on the drift layer 12, and, for example, Al which is a p-type impurity is ion-implanted with interposition of the mask. Thereby, the base regions 13 are selectively formed as shown in FIG. 13. The depth of implantation of Al is 0.5 to 3.0 μm, and the concentration of implantation is $1\times10^{16}$ to $1\times10^{19}$ $cm^{-3}$.

Figure 14:
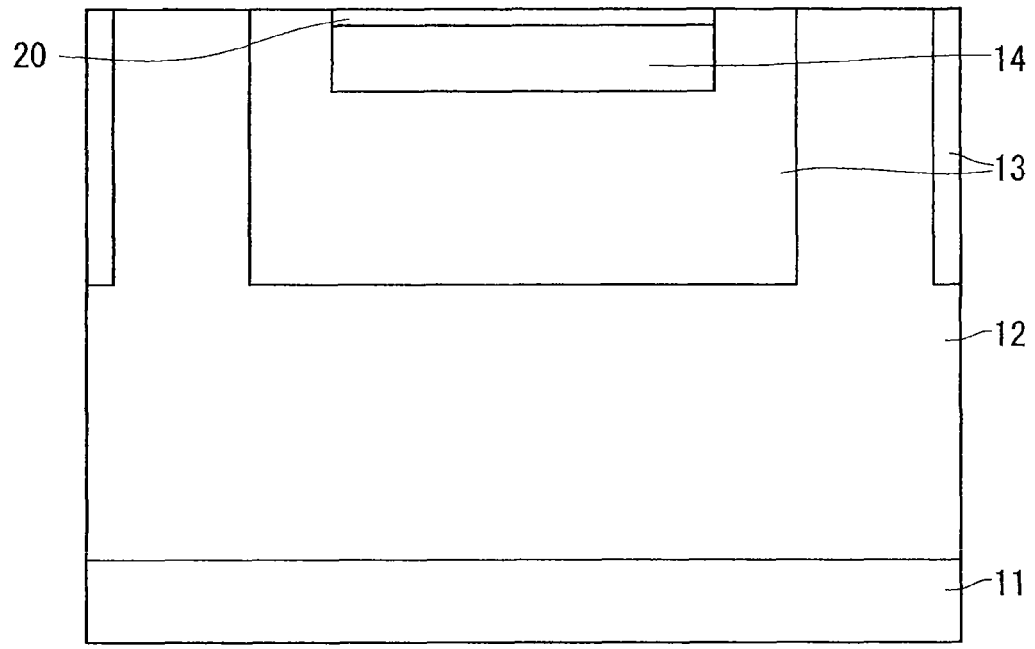
FIG. 14 A diagram showing the step of forming a source region in the method for manufacturing the silicon carbide semiconductor device according to the embodiment 2 of the present invention.

After the mask is removed, a new mask made of a resist is formed on the drift layer 12, and N which is an n-type impurity is ion-implanted with interposition of the mask. Thereby, the lower-layer source region 14 is formed as shown in FIG. 14. At this time, the process is performed such that the lower-layer source region 14 is selectively formed in a superficial layer of the base region 13. The profile of implantation of N is as shown in FIG. 20, and the peak concentration of implantation is $1\times10^{19}$ to $1\times10^{21}$ $cm^{-3}$.

Then, with interposition of the same mask as described above, for example, Al which is a p-type impurity is ion-implanted. Thereby, as shown in FIG. 14, the p-type region 20 serving as the upper-layer region is formed in an upper layer of the lower-layer source region 14. The profile of implantation of Al is as shown in FIG. 20. In a region of the drift layer 12 ranging from the most superficial surface to the 100 nm depth, the concentration of implantation is equal to or higher than $1\times10^{16}$ $cm^{-3}$.

Figure 15:
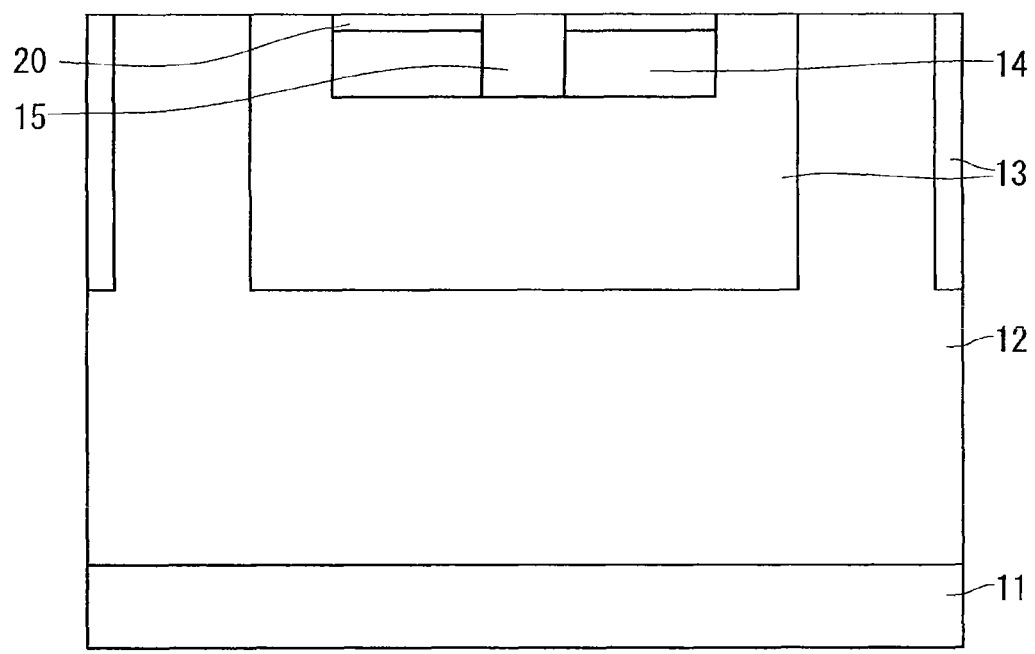
FIG. 15 A diagram showing the step of forming a contact region in the method for manufacturing the silicon carbide semiconductor device according to the embodiment 2 of the present invention.

After the mask is removed, a new mask made of a resist or silicon oxide is formed on the drift layer 12, and Al which is a p-type impurity is ion-implanted with interposition of the mask. Thereby, the contact region 15 is formed as shown in FIG. 15. The depth of implantation of Al is 0.05 to 1.5 μm, and the concentration of implantation is $1\times10^{19}$ to $1\times10^{21}$ $cm^{-3}$.

Then, the mask is removed, and activation annealing is performed under an inert gas atmosphere and in a temperature range of 1300 to 2100° C. This electrically activates the base region 13, the lower-layer source region 14, the p-type region 20, and the contact region 15 that are formed in a superficial layer of the drift layer 12.

Then, a thermal oxidation film is formed on a surface of the drift layer 12 at 800 to 1400° C., and is removed by using hydrofluoric acid (sacrificial oxidation process).

Figure 16:
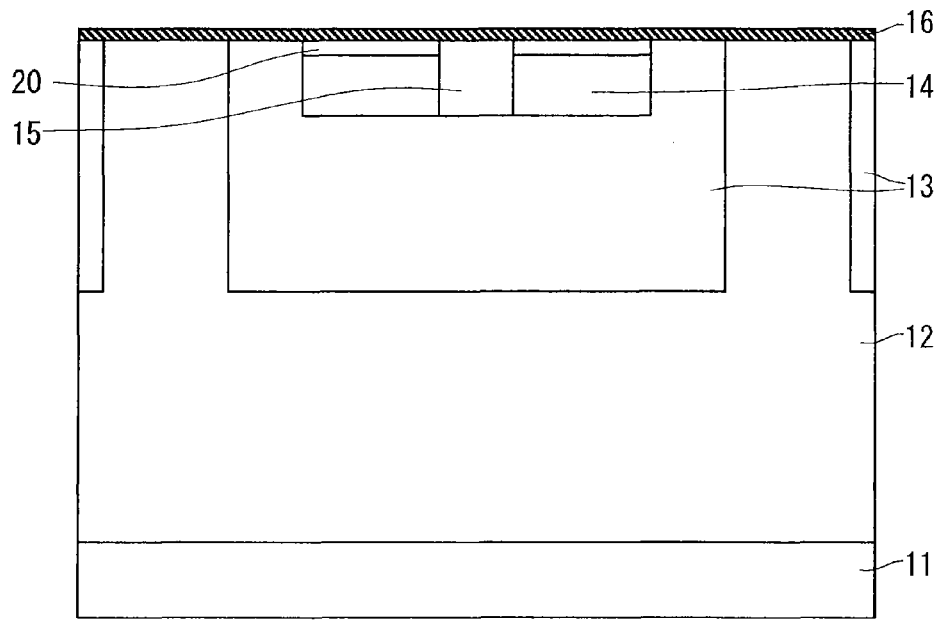
FIG. 16 A diagram showing the step of forming a gate insulating film in the method for manufacturing the silicon carbide semiconductor device according to the embodiment 2 of the present invention.

Then, as shown in FIG. 16, the surface of the drift layer 12 is thermally oxidized, so that the gate insulating film 16 having a desired thickness is formed.

Figure 17:
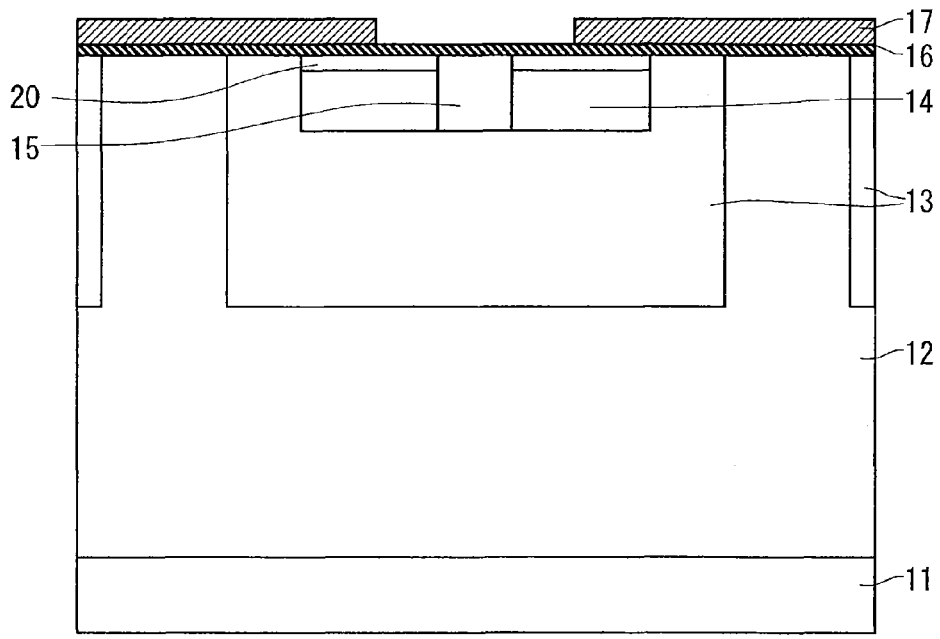
FIG. 17 A diagram showing the step of forming a gate electrode in the method for manufacturing the silicon carbide semiconductor device according to the embodiment 2 of the present invention.

Then, as shown in FIG. 17, a polycrystalline silicon film having conductive properties is formed on the gate insulating film 16 through a low-pressure CVD process, and the gate electrode 17 is formed by using a lithography technique and an etching technique. The material of the gate electrode 17 is not limited to polycrystalline silicon, but may be any of nickel (Ni), titanium (Ti), aluminum (Al), molybdenum (Mo), chromium (Cr), platinum (Pt), tungsten (W), silicon (Si), titanium carbide (TiC), or alloys thereof.

Figure 18:
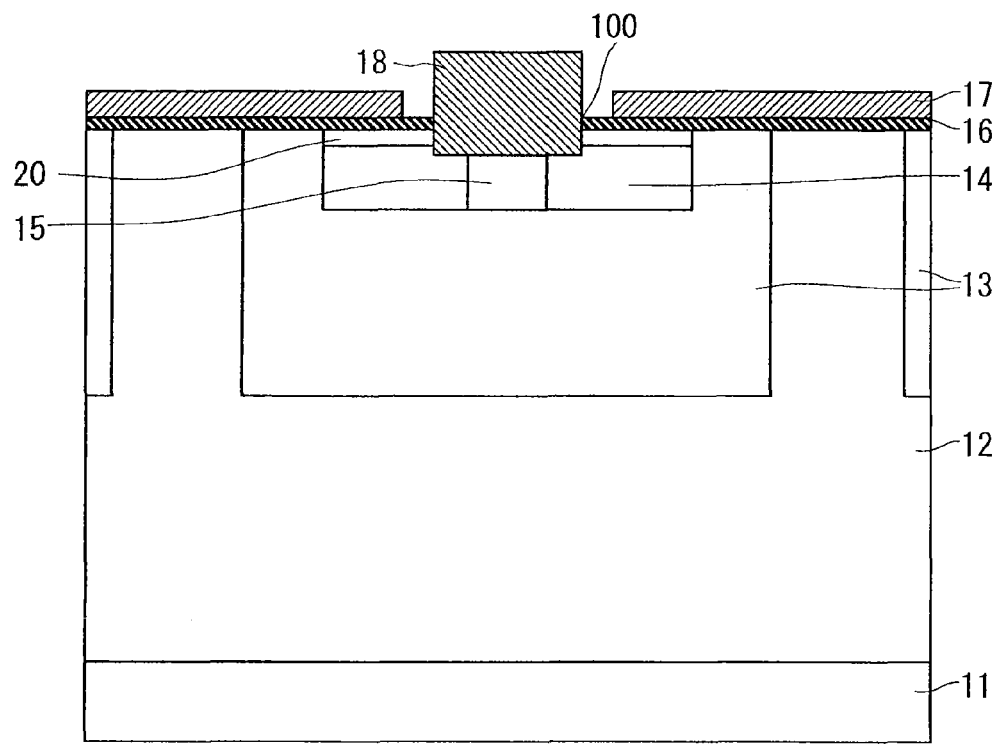
FIG. 18 A diagram showing the step of forming a source electrode in the method for manufacturing the silicon carbide semiconductor device according to the embodiment 2 of the present invention.

Then, as shown in FIG. 18, a portion of the gate insulating film 16 above a region where the source region and the contact region 15 are formed is removed by using a lithography technique and an etching technique, and furthermore, the superficial layer of the drift layer 12 is etched until the lower-layer source region 14 is exposed on the surface, to thereby form the trench 100. Then, Ni layers are formed within the trench 100, to form the source electrode 18 that is electrically in ohmic connection with both the lower-layer source region 14 and the contact region 15.

Here, the material of the source electrode 18 is not limited to Ni, but may be any of Ti, Al, Mo, Cr, Pt, W, Si, TiC, or alloys thereof.

Figure 19:
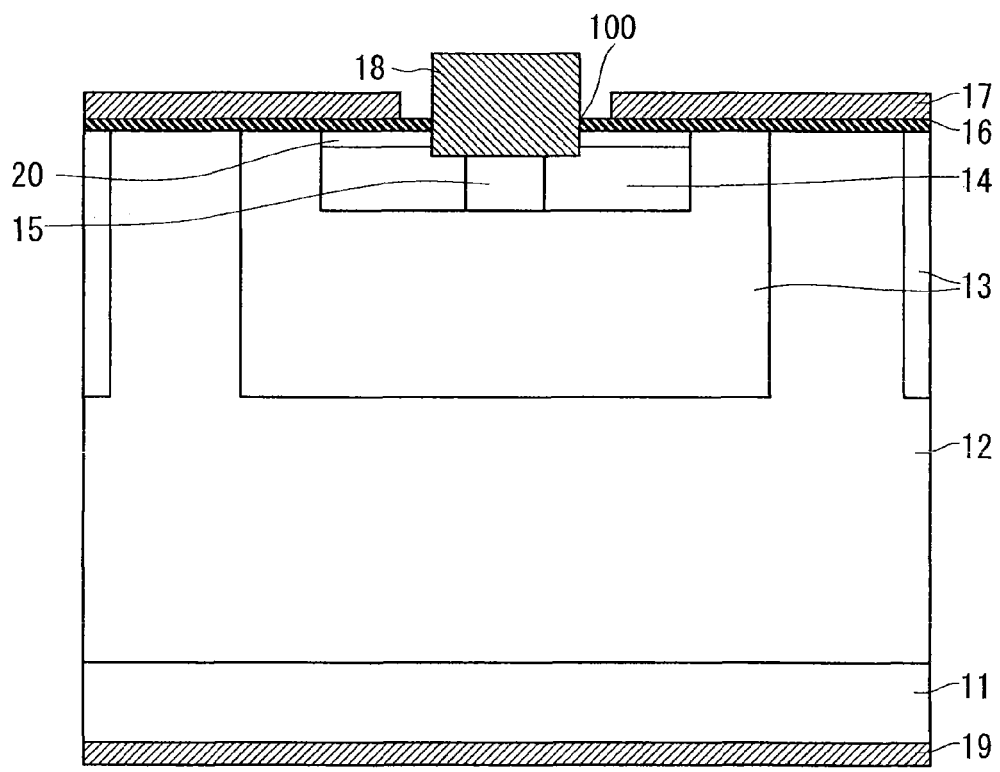
FIG. 19 A diagram showing the step of forming a drain electrode in the method for manufacturing the silicon carbide semiconductor device according to the embodiment 2 of the present invention.

Then, as shown in FIG. 19, the drain electrode 19 is formed throughout a surface of the silicon carbide substrate 11 opposite to the main surface thereof. The material of the drain electrode 19 may be, similarly to the material of the source electrode 18, any of Ni, Ti, Al, Mo, Cr, Pt, W, Si, TiC, or alloys thereof.

Finally, a heat treatment is performed for alloying, with silicon carbide, a portion where the source electrode 18 is in contact with the lower-layer source region 14 and the contact region 15 and a portion where the drain electrode 19 is in contact with the silicon carbide substrate 11. This heat treatment is performed under the condition of, for example, temperature: 950 to 1000° C., processing time: 20 to 60 sec, and speed of temperature rise: 10 to 25° C./sec.

Through the above-described process, the silicon carbide semiconductor device according to this embodiment is completed.

In the silicon carbide semiconductor device illustrated in this embodiment, the conduction band of the p-type region 20 is shifted to the high energy side due to band bending, so that occurrence of FN tunneling of conduction electrons of the n-type lower-layer source region 14 to the gate insulating film 16 side at a time of application of a positive bias to the gate can be suppressed. Thus, the reliability of the gate can be improved.

Additionally, the source electrode 18 is formed in a region where the trench 100 is engraved, in order to obtain a good ohmic contact with the lower-layer source region 14.

The p-type doping concentration in a portion of the MOSFET where a channel is formed is set to a sufficiently low value, so that the channel is formed up to a deep position. This enables conduction electrons to smoothly flow from the lower-layer source region 14 to the channel and further to the drift layer 12 (drain side) at a time of on-operation of the MOSFET.

In the embodiments described above, a silicon carbide substrate having 4H polytype whose main surface has a plane orientation of (0001) plane is adopted. However, the plane orientation is not limited thereto, but may be (000-1) plane, (11-20) plane, or the like. The main surface having an off angle relative to these plane orientations may be also acceptable. The polytype may be 3C, 6H, or the like.

Although the above-described embodiments illustrate the silicon carbide MOSFET having an n-type channel in which the first conductivity type is n-type and the second conductivity type is p-type, the present invention can exert the same effects also in a silicon carbide MOSFET having a p-type channel in which the first conductivity type is p-type and the second conductivity type is n-type.

In the above description, Al is adopted as the p-type impurity, but boron (B), gallium (Ga), or the like, is also adoptable. In the above description, N is adopted as the n-type impurity, arsenic (As), phosphorus (P), or the like, is also adoptable.

<B-3. Effects>

In the embodiment of the present invention, the silicon carbide semiconductor device includes: the drift layer 12 having the first conductivity type and made of silicon carbide; the base region 13 having the second conductivity type and selectively formed in the superficial layer of the drift layer 12; the source region selectively formed in the superficial layer of the base region 13; the source electrode 18 selectively formed on the source region; the gate insulating film 16 formed so as to extend over the drift layer 12, the base region 13, and an area of the source region where the source electrode 18 is not formed; and the gate electrode 17 formed on the gate insulating film 16. The source region includes the p-type region 20 serving as the upper-layer region having the second conductivity type and formed in the superficial portion, and the lower-layer source region 14 serving as the lower-layer region having the first conductivity type and formed in a lower layer below the p-type region 20. The source electrode 18 has its lower end buried in the source region so as to reach the lower-layer source region 14, so that the conduction band of the p-type region 20 is shifted to the high energy side due to band bending, to thereby suppress occurrence of FN tunneling of conduction electrons of the n-type lower-layer source region 14 to the gate insulating film 16 side at a time of application of a positive bias to the gate. Thus, the reliability of the gate is improved.

Moreover, since the source electrode 18 is formed on the trench 100, a good ohmic contact with the lower-layer source region 14 can be obtained.

In the embodiment of the present invention, in the silicon carbide semiconductor device, the boundary between the p-type region 20 serving as the upper-layer region and the lower-layer source region 14 serving as the lower-layer region is located at a depth of 5 to 100 nm from the superficial layer of the p-type region 20. This can prevent an increase in the on-resistance with suppression of occurrence of FN tunneling.

In the embodiment of the present invention, a method for manufacturing the silicon carbide semiconductor device includes the steps of: (a) forming the drift layer 12 having the first conductivity type and made of silicon carbide; (b) selectively forming the base region 13 in the superficial layer of the drift layer 12, the base region 13 having the second conductivity type; (c) selectively forming the source region in the superficial layer of the base region 13, the source region including the p-type region 20 serving as the upper-layer region having the second conductivity type and formed in the superficial portion and the lower-layer source region 14 serving as the lower-layer region having the first conductivity type and formed in the lower layer below the p-type region 20; (d) forming the gate insulating film 16 so as to extend over the drift layer 12, the base region 13, and the source region; (e) forming the gate electrode 17 on the gate insulating film 16 such that the gate electrode 17 extends from the superficial layer of the drift layer 12 into the superficial layer of the source region; (f) forming the trench 100 that extends from an area of the surface of the gate insulating film 16 where the gate electrode 17 is not formed and reaches the lower-layer source region 14; and (g) forming the source electrode 18 such that its lower end is buried in the trench 100. This can suppress occurrence of FN tunneling of conduction electrons of the n-type lower-layer source region 14 to the gate insulating film 16 side. Thus, the reliability of the gate is improved.

While the invention has been described in detail, the foregoing description is in all aspects illustrative and not restrictive. It is therefore understood that numerous modifications and variations not illustrated herein can be devised without departing from the scope of the invention.

DESCRIPTION OF THE REFERENCE NUMERALS

1, 11 silicon carbide substrate; 2, 12 drift layer; 3, 13 base region; 4 first source region; 10 second source region; 14 lower-layer source region; 5, 15 contact region; 6, 16 gate insulating film; 7, 17 gate electrode; 8, 18 source electrode; 9, 19 drain electrode; 20 p-type region; and 100 trench.

The invention claimed is:

1. A silicon carbide semiconductor device comprising:
   a drift layer having a first conductivity type and made of silicon carbide;
   a base region having a second conductivity type and selectively formed in a superficial layer of said drift layer;
   a source region having the first conductivity type and selectively formed in a superficial layer of said base region;
   a source electrode selectively formed on said source region;
   a gate insulating film formed so as to extend over said drift layer, said base region, and an area of said source region where said source electrode is not formed; and
   a gate electrode formed on said gate insulating film,
   said source region including a first source region and a second source region, said first source region being arranged below said source electrode, said second source region being arranged below said gate electrode and formed so as to surround said first source region in a plan view,
   a doping concentration in a superficial layer of said second source region being lower than a doping concentration in a superficial layer of said first source region, a doping concentration in said second source region being higher in a deep portion than in a superficial portion thereof.

2. The silicon carbide semiconductor device according to claim 1, wherein
the doping concentration in a region of said second source region ranging from the superficial layer to the 100 nm depth is lower than the doping concentration in the superficial layer of said first source region.

3. The silicon carbide semiconductor device according to claim 1, wherein
the doping concentration in a region of said second source region ranging from the superficial layer to the 100 nm depth is $1\times10^{16}$ to $1\times10^{18}$ cm$^{-3}$.

4. The silicon carbide semiconductor device according to claim 1, wherein
the doping concentration in the superficial layer of said first source region is $1\times10^{19}$ to $1\times10^{21}$ cm$^{-3}$.

5. The silicon carbide semiconductor device according to claim 1, wherein
the relationship of $4d_{OX}/3 < d_X < d_{GS} + d_{pcon}/2 - 0.5\times(\rho cS/RN + d_{pcon}^2)^{1/2}$ is satisfied, where:
an end portion of said gate electrode at said source electrode side is defined as the origin of the horizontal coordinate axis;
$d_X$ represents the distance from said origin to said second source region;
$d_{GS}$ represents the distance from said origin to the center of said source electrode;
$d_{ncon}$ represents the horizontal width of said first source region;
$d_{OX}$ represents the vertical thickness of said gate insulating film;
$d_{ncon}^2$ represents the area of said first source region;
N represents the number of cells included in an element;
S represents the area of an active region of the element;
$\rho c$ represents the ohmic contact resistivity;
R represents the on-resistivity of the element; and
$d_{pcon}$ represents the horizontal width of a contact region having the second conductivity type and formed within said first source region, said contact region having a higher impurity concentration than the impurity concentration in said base region.

6. A silicon carbide semiconductor device comprising:
a drift layer having a first conductivity type and made of silicon carbide;
a base region having a second conductivity type and selectively formed in a superficial layer of said drift layer;
a source region selectively formed in a superficial layer of said base region;
a source electrode selectively formed on said source region;
a gate insulating film formed so as to extend over said drift layer, said base region, and an area of said source region where said source electrode is not formed; and
a gate electrode formed on said gate insulating film,
said source region including an upper-layer region and a lower-layer region, said upper-layer region having the second conductivity type and formed in a superficial portion, said lower-layer region having the first conductivity type and formed in a lower layer below said upper-layer region,
said source electrode having a lower end thereof buried in said source region so as to reach said lower-layer region,
said upper-layer region of said source region being formed directly on said lower-layer region of said source region.

7. The silicon carbide semiconductor device according to claim 6, wherein
the boundary between said upper-layer region and said lower-layer region is located at a depth of 5 to 100 nm from a superficial layer of said upper-layer region.

8. The silicon carbide semiconductor device according to claim 6, wherein
an entire width of said upper-layer region of said source region is formed on said lower-layer region of said source region.

9. The silicon carbide semiconductor device according to claim 6, wherein
an edge of said upper-layer region of said source region which is furthest away from said source electrode is vertically aligned with an edge of said lower-layer region of said source region which is furthest away from said source electrode.

* * * * *